United States Patent [19]

Shimura

[11] Patent Number: 4,520,382

[45] Date of Patent: May 28, 1985

[54] SEMICONDUCTOR INTEGRATED CIRCUIT WITH INVERSION PREVENTING ELECTRODE

[75] Inventor: Tastuo Shimura, Hitachi, Japan

[73] Assignee: Hitachi, Ltd., Tokyo, Japan

[21] Appl. No.: 303,134

[22] Filed: Sep. 17, 1981

[30] Foreign Application Priority Data

Sep. 17, 1980 [JP] Japan ................... 55-127993

[51] Int. Cl.³ ............... H01L 29/40; H01L 27/04; H01L 27/12; H01L 25/04
[52] U.S. Cl. ......................... 357/53; 357/50; 357/49; 357/84
[58] Field of Search .............. 357/53, 50, 49, 84

[56] References Cited

U.S. PATENT DOCUMENTS 3,544,861 12/1970 Kooi ........................... 357/52
3,836,998 9/1974 Koscis et al. ................. 357/53
3,961,358 6/1976 Polinsky ....................... 357/53

FOREIGN PATENT DOCUMENTS 54-129887 10/1979 Japan ......................... 357/49

Primary Examiner—Martin H. Edlow
Assistant Examiner—Jerome Jackson
Attorney, Agent, or Firm—Antonelli, Terry & Wands

[57] ABSTRACT

A semiconductor monolithic integrated circuit device in which leakage current is decreased. An island region of a first conductivity type formed in a semiconductor chip has at least two diffused regions of a second conductivity type opposite to the first conductivity type. An insulation film is deposited on the island region. The island region and the diffused regions are contacted with respective electrodes with low resistances through openings formed in the insulation film. An inversion stopping electrode is provided for and connected to the electrode of at least one of the diffused regions. The inversion stopping electrode is so disposed as to enclose the one diffused region against the other diffused region in cooperation with the boundary of the island region as viewed in a plane of the semiconductor chip. Upon application of a voltage, a depletion layer or inversion layer extending from the other diffused region terminates at a position immediately below the inversion stopping electrode, whereby possibility of leakage current flowing through the inversion layer is reduced.

32 Claims, 11 Drawing Figures

SEMICONDUCTOR INTEGRATED CIRCUIT WITH INVERSION PREVENTING ELECTRODE

The present invention relates in general to a semiconductor integrated circuit, and more particularly concerns a monolithic semiconductor integrated circuit device suited for suppressing a leakage current ascribable to an inversion layer accompanied to MOS (Metal-oxide-Semiconductor) structure.

The monolithic semiconductor integrated circuit device is constituted by a semiconductor chip in which a plurality of island regions (also referred to simply as islands) are formed and isolated through PN-junctions, dielectric insulators or air insulators. An active element such as a transistor, thyristor or the like and/or passive elements such as resistor, capacitor or the like may be formed in each island and connected by wirings deposited on the semiconductor surface in a desired circuit configuration. In most cases, the wirings are provided on an insulation film deposited on the semiconductor chip. Connection of the wirings to the associated individual elements are accomplished by electrodes forming a low resistance contact to a diffused region of the element through an aperture or hole formed in the insulation film. In the case of a bipolar transistor and a lateral thyristor (triac), it is desirable to suppress a leakage current to as small a value as possible in the voltage blocking state. Occurrence of the leakage current may be ascribable to formation of an inversion layer at an interface between the semiconductor chip and the insulation film upon application of a voltage between the electrodes. By way of example, in the case of a PNP-transistor, the PN-junction which blocks a potential which is applied to the emitter with positive polarity relative to that of the collector is a collector junction formed by an N-type base layer and a P-type collector layer. More specifically, a depletion layer is produced around the collector junction to thereby block the voltage. However, when the voltage applied between the collector and the emitter is increased, lateral polarization tends to take place in the insulation film and/or a second insulation film covering the electrodes and the wirings. Such lateral polarization may be ascribed to the movement of positive ions existing in the insulation film. Due to this polarization, a vertical electric field is induced at the interface between the first insulation film and the semiconductor chip. This induced electric field may deplete and further invert a surface layer of the N-type base layer adjacent to the semiconductor chip surface. Such an inversion layer is usually called "channel". In case the depletion layer extends through the N-type base layer to the P-type emitter layer, the inversion layer will electrically connect the P-type collector layer and the P-type emitter layer to each other. As the consequence, a current is allowed to flow through the inversion layer to give rise to the leakage current.

In this manner, the electric charge induced in the insulation layer or layers by the polarization resembles a gate electrode in a MOS transistor. In a MOS transistor, a gate electrode is formed on an insulation film to positively induce an inversion layer for allowing a current to flow therethrough. However, this MOS-like structure produced due to the electric charge induced in the insulation film in the bipolar transistor and the lateral type thyristor only brings about an increase in the leakage current. To deal with this problem, it has been proposed in the bipolar transistor and the lateral type thyristor that a field plate is additionally attached to the electrode as an approach to reduce the leakage current (for example, see Japanese Laid-Open Patent Application No. 40-15139).

More specifically, the field plate may be provided on an insulation layer, extending from an emitter electrode which forms a low-resistance contact to a diffused emitter region, to a base region across an emitter junction formed by the emitter region and the base region. With this structure, the depletion layer or the inversion layer extending from the collector side is caused to terminate immediately below the field plate and thus prevented from reaching the emitter region. As the consequence, the current leakage is suppressed. In other words, the field plate is at a potential equal to that of the emitter electrode, whereby occurrence of the polarization in the insulation layer is confined to a region lying between a tip of the field plate and the edge of the collector electrode, as the result of which generation of the depletion layer and the inversion layer is limited only to a region lying between the field plate and the collector electrode.

In the bipolar transistor and the lateral type thyristor, a certain diffused region of a first conductivity type may be independently formed within a given island region of a second conductivity type opposite to the first conductivity type, another diffused region of the second conductivity type may be doubly diffused in a region of the first conductivity type in an island. For example, the collector layer of a transistor and the anode side emitter layer of a thyristor are provided independently, while the base layer and the emitter layer of a bipolar transistor and the base layer and the emitter layer on the cathode side of a thyristor usually take the duplicate structure. In the case of the independent or single diffused layer, it is possible to cover entirely the exposed edge of a PN-junction with an electrode contacting the diffused layer. However, in the case of the duplicate or double diffusion structure, it is difficult to cover each PN-junction edge completely with an electrode, because two electrodes have to be contacted to the associated diffused regions with a low resistance and to be extended outwards. Thus, the function of the field plate is degraded at the region between these two electrodes and the depletion layer and hence the inversion layer may be formed to allow a flow of a leakage current, thereby degrading the blocking characteristic.

An object of the present invention is to provide a semiconductor integrated circuit device in which the inversion layer is prevented from being produced, to thereby reduce the leakage current.

Another object of the present invention is to provide a semiconductor integrated circuit device which exhibits a high blocking voltage.

A further object of the present invention is to provide a semiconductor integrated circuit device which can reduce the leakage current without increasing the number of fabricating steps.

According to an aspect of the present invention, there is provided a semiconductor integrated circuit device in which at least two diffused regions of a first conductivity type are formed in an island region of a second conductivity type opposite to the first conductivity type, each of the diffused regions being contacted with an electrode with low resistance, wherein an inversion preventing electrode is provided on an insulation film covering the island region and is applied with a potential equal or approximating to the potential applied to one of the diffused regions, whereby one of the diffused regions is enclosed against the other diffused region by a boundary formed between the inversion preventing electrode and the island region.

Figure 9:
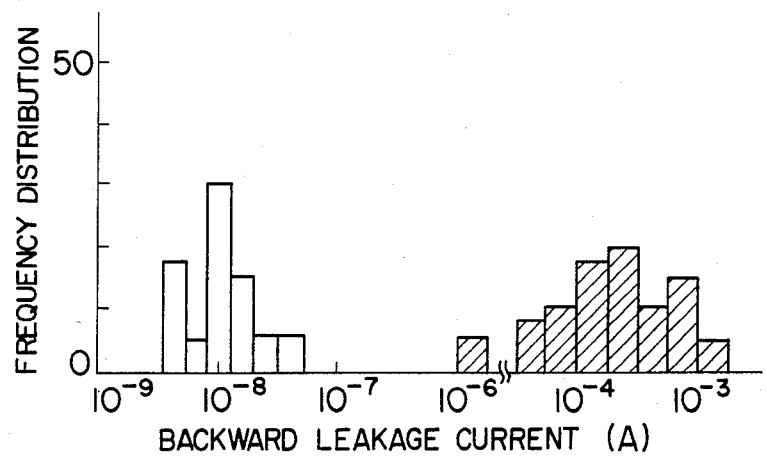
Figure 10:
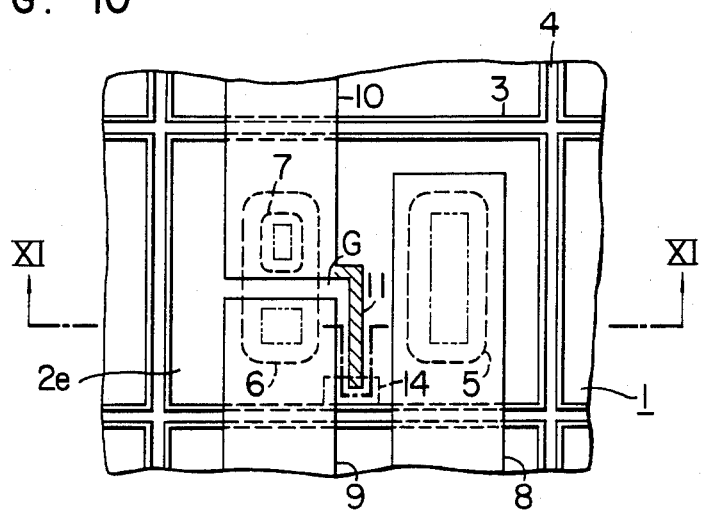
Figure 11:
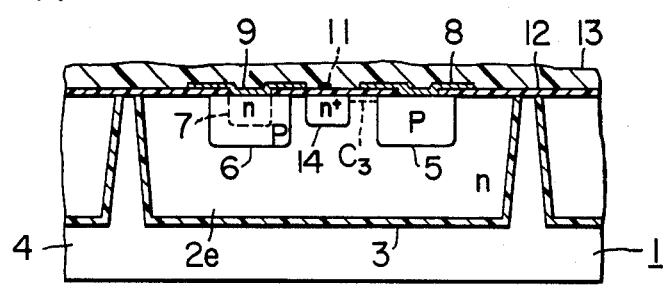

FIG. 9 graphically illustrates distribution of backward leakage current in thyristors according to the present invention in comparison with that in the conventional thyristors;

FIG. 10 shows in a fragmental plan view a semiconductor chip according to an alternative embodiment of the present invention; and FIG. 11 is a vertical sectional view taken along the line XI—XI in FIG. 10.

Figure 1:
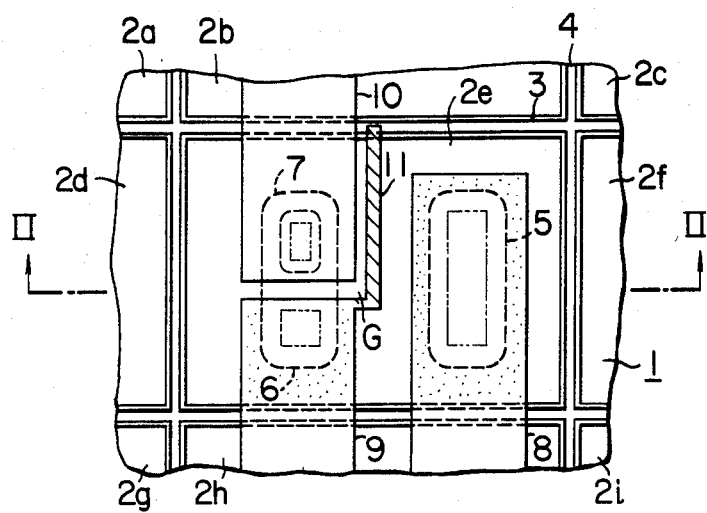
FIG. 1 is a fragmental plan view of a semiconductor chip showing an embodiment of the present invention.
Figure 2:
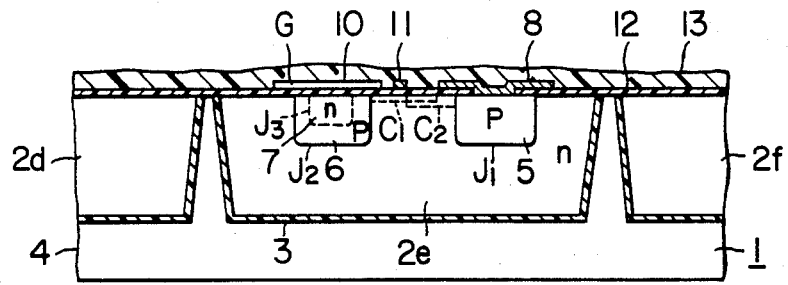
FIG. 2 shows a vertical sectional view of the same taken along the line II—II in FIG. 1.

Referring to FIGS. 1 and 2, a reference numeral 1 denotes a semiconductor chip which is of a dielectric isolation type. Single crystal silicon island regions or islands $2a, \ldots, 2i$ of N conductivity type are embedded in a polycrystalline silicon support plate 4 through interposition of respective silicon oxide ($SiO_2$) films 3 which are the dielectric. The following description will be made primarily on an island 2e in which a thyristor is formed.

It will be noted that the island 2e is insulated from the other islands 2a, 2b, 2c, 2d, 2f, 2g, 2h and 2i and from the supporting or carrier region 4 by the silicon oxide film 3 which constitutes the boundary of the island 2e. A p-type emitter (or anode) region 5 and a p-type base region 6 are formed within the island region 2e through selective diffusion process which per se is known in the art. There is additionally formed an n-type emitter (or cathode) region 7 in the p-type base (or gate) region 6. These impurity diffused regions are indicated by broken lines in FIG. 1. The region where no impurity is diffused constitutes as N-type base region of the thyristor. The top surface of the semiconductor chip 1 is passivated with a silicon oxide ($SiO_2$) film 12 (not shown in FIG. 1). An anode electrode 8, a gate electrode 9 and a cathode electrode 10 are formed on the associated diffused regions 5, 6 and 7, respectively, through openings formed in the silicon oxide film 12. Locations of these openings formed in the silicon oxide film 12 are indicated by double-dotted broken lines in FIG. 1. In the figure, those portions of the electrodes 8 and 9 which serve as the field plate exhibiting the function described hereinbefore are indicated by dotted areas in FIG. 1. For protecting a gap region G between the gate electrode 9 and the cathode electrode 10 against an inversion layer extending from the P-type emitter region 5, an inversion preventing or stopping electrode 11 is provided so as to extend from the gate electrode 9 to the silicon oxide film 3 (i.e. the dielectric island boundary) to intervene between the gap region G and the anode region 5. A silicone resin passivation layer 13 is provided to cover the electrodes.

A thyristor is constituted by the P-type emitter (or anode) region 5, the N-conductivity type base region 2e, the P-type base (or gate) region 6 and the N-type emitter (or cathode) region 7 together with the anode electrode 8, the gate electrode 9 and the cathode electrode 10. Description will be made below on the forward voltage blocking state of the thyristor in which a forward or positive voltage is applied to the anode electrode 8 relative to the cathode electrode 10.

It is mainly a junction $J_2$ formed by the N-type base region 2e and the P-type base or gate region 6 that serves for blocking the forward voltage. A depletion layer is produced on both side of the PN-junction $J_2$. In this state, difference in potential between the P-type base region 6 and the N-type emitter or cathode region 7 is of a small magnitude, so that the potential at the inversion preventing electrode 11 can be considered substantially equal to the potential at the cathode electrode. Consequently, across the silicon oxide film 12 and the silicone resin layer 13, polarization occurs under the influence of the voltage applied between the anode electrode 8 and the inversion preventing electrode 11. Then, even if the inversion layer which is produced through induction of positive charge in the N-type base layer 2e should tend to extend along the interface between the chip 1 and the silicon passivation film 12 from the PN-junction $J_2$ toward the PN-junction $J_1$, the inversion layer will be terminated immediately below the anode electrode 8 and thus prevented from reaching the PN-junction $J_1$. In other words, the P-type emitter or anode region 5 and the P-type gate region 6 are not electrically coupled to each other through the inversion layer. Such inversion preventing or stopping function is ascribable to the action of the field plate provided for the anode electrode 8. The inversion layer as produced is designated by $C_1$ in FIG. 2.

Next, a reverse voltage blocking state positive which is applied at the cathode electrode 10 relative to that of the anode electrode 8 will be described.

It is the PN-junction $J_1$ formed by the P-type emitter or anode region 5 and the N-type base region 2e on one hand and the junction $J_3$ formed by the P-type base or gate region 6 and the N-type emitter or cathode region 7 on the other hand that serve for blocking the reverse voltage. The PN-junction $J_3$ is poor in the reverse voltage blocking capability. A larger portion of the reverse voltage is borne by the PN-junction $J_1$. Since the P-type base region 6 is at a potential substantially equal to the potential at the N-type emitter region 7, the potential at the inversion preventing or stopping electrode 11 is approximately equal to the potential at the cathode electrode 10. The depletion layer is produced on the both sides of the PN-junction $J_1$, and polarization takes place between the anode electrode 8 and the inversion layer preventing electrode 11. The inversion layer extends from the PN-junction $J_1$ toward the PN-junction $J_2$ along the interface between the chip 1 and the silicon oxide film 12 and is terminated at the inversion stopping electrode 11. This inversion layer is indicated by $C_2$. In other words, the inversion layer $C_2$ provides no electrical coupling between the P-type emitter region 5 and the P-type base region 6. Further, by virtue of such arrangement that the P-type base region 6 is completely enclosed against the P-type emitter region 5 by the silicon oxide boundary 3, the inversion stopping or preventing electrode 11 and the gate electrode 9 in the plane shown in FIG. 1. Thus, the inversion layer $C_2$ extending from the PN-junction $J_1$ is prevented from reaching the P-type base layer 6. This is the inversion preventing or stopping function of the electrode 11. It is also noted that the field plate portion of the gate electrode 9 indicated by the dotted area in FIG. 1 is effective to prevent or stop the extension of the inversion layer $C_2$ in the reverse voltage blocking state. Thus, the electrode 11 is effective for stopping extension of the inversion layer $C_2$ to the gap portion G and to the portion below the cathode electrode 10. In short, the inversion layer is blocked from excessive extension both in the forward and reverse voltage blocking state, thereby reducing the leak current through the inversion layer.

Figure 3:
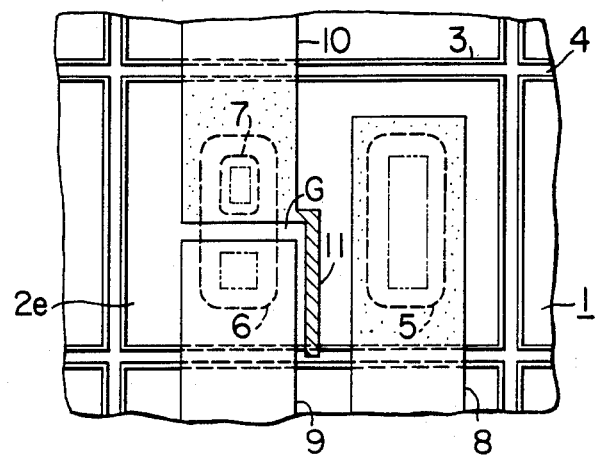
FIG. 3 is a fragmental plan view of a semiconductor chip showing another embodiment of the present invention.

Referring to FIG. 3, there is shown another embodiment of the present invention which differs from the semiconductor integrated circuit device described above and shown in FIGS. 1 and 2 in that the inversion preventing or stopping electrode 11 of this embodiment is coupled with the cathode electrode 10. It may be noted that, in the case of the embodiment shown in FIGS. 1 and 2, the inversion preventing or stopping electrode 11 is coupled with the gate electrode in view of the fact that the gate electrode 9 is at a potential substantially equal to that of the cathode electrode 10. The potential difference between the electrodes 9 and 10 is at most of the order of the diffusion potential across the PN-junction $J_3$, i.e. about 1 volt for silicon.

In FIG. 3, like parts to those shown in FIGS. 1 and 2 are denoted by like reference symbols.

The inversion preventing or stopping function in the semiconductor integrated circuit device shown in FIG. 3 is almost identical with that described above by referring to FIGS. 1 and 2 except that the region of the cathode electrode 10 which is indicated by the dotted area serves as the field plate. (Accordingly, further description will be unnecessary).

Figure 4:
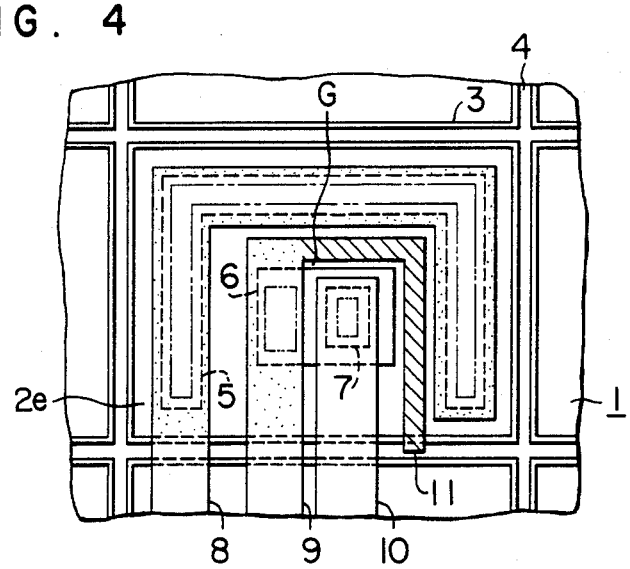
FIG. 4 shows a fragmental plan view of a semiconductor chip showing a still another embodiment of the invention.
Figure 5:
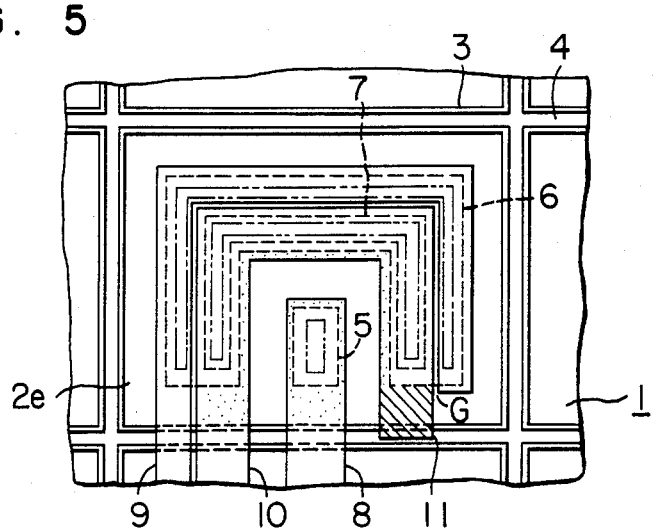
FIG. 5 is a fragmental plan view of a semiconductor chip showing a further embodiment of the invention.

FIGS. 4 and 5 show thyristors having different patterns and having respective inversion preventing or stopping electrode. In FIGS. 4 and 5, like parts to those shown in FIGS. 1 and 2 are denoted by like reference numerals or symbols.

In the case of the thyristor shown in FIG. 4, there are formed in a center portion of the island region 2e, a P-type base or gate region 6 and an N-type emitter or cathode region 7 formed in the gate region 6. Both of these regions 6 and 7 are of rectangular shape and surrounded by a P-type emitter region 5 of a U-shape. A gap region G between a gate electrode 9 and a cathode electrode 10 is enclosed against the anode electrode 8 by the inversion preventing or stopping electrode 11 coupled with the gate electrode 9 in cooperation with a silicon oxide boundary 3 and the gate electrode 9.

In the case of the thyristor shown in FIG. 5, the P-type emitter or anode region 5 is located at a central portion of the island region 2e and enclosed by a P-type base or gate region 6 and an N-type emitter or cathode region 7. An inversion preventing electrode 11 is connected with a cathode electrode 10.

Figure 6:
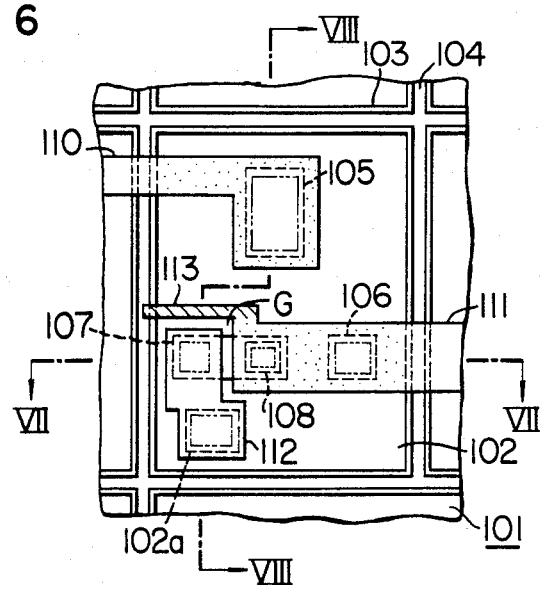
FIG. 6 is a fragmental plan view of a semiconductor chip showing a modified embodiment of the invention.
Figure 7:
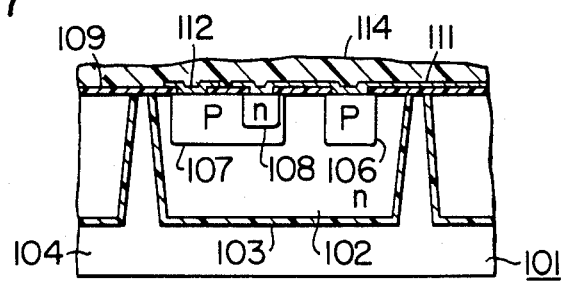
FIG. 7 is a vertical sectional view of the semiconductor chip shown in FIG. 6 and taken along the line VII—VII in the same figure.
Figure 8:
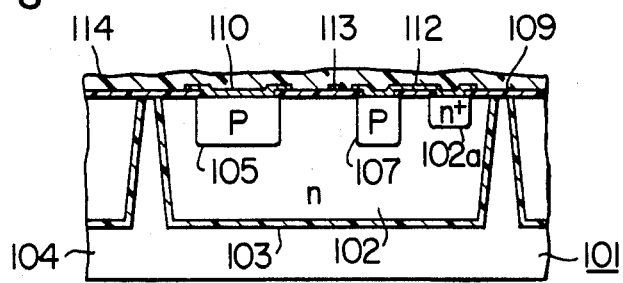
FIG. 8 shows a vertical sectional view taken along the line VIII—VIII in FIG. 6.

FIGS. 6 to 8 show another embodiment of the invention, which circuit provides a current signal when a sharply rising pulse is delivered thereto. Such current signal may be utilized to drive a protection circuit. A semiconductor chip 101 is of dielectric isolation type in which single crystal silicon islands 102 of N-type are formed in a polycrystalline silicon carrier 104 and isolated from each other by respective silicon oxide films 103.

There are formed a transistor and a diode in the island region 102. More particularly, P-type diffused regions 105 and 106 constitute a collector region and an emitter region, respectively, while the island region intervening between the emitter and the collector regions 105 and 106 constitutes a base region. Further, there is formed in the island region 102 another P-type diffused region 107 in which a further N-type region 108 is diffused, so as to constitute an anode and a cathode region of a diode. As is shown in FIGS. 7 and 8, a collector electrode 110 is contacted with a low resistance to the P-type collector region 105 through an opening formed in a silicon oxide film 109 which is provided on a chip 101, while an emitter electrode 111 is ohmic-contacted to the P-type emitter region 106. The emitter electrode 111 is additionally ohmic-contacted to the cathode region 108 of the diode. There is formed in the base region 102 a region 102a which is heavily doped with an N-type impurity. The region 102a is connected to the anode region 107 of the diode by a wiring 112.

With the pattern configuration of the semiconductor chip 101 described above, when a voltage is applied in such polarity that the potential on the P-type emitter region 106 is positive relative to the P-type collector region 105, a PN-junction between the collector region 105 and the base region 102 on one hand and a PN-junction formed between the anode region 107 and the cathode region 108 on the other hand serve as the voltage blocking junctions. The collector junction is charged by the applied voltage and a base current is amplified by the transistor to provide an amplified current signal. The diode works to discharge the base region when the voltage is cut off. By the application of the voltage, a depletion layer and hence an inversion layer tend to extend from the collector region 105 toward the gap region G formed between the emitter electrode 111 and the wiring 112. For this reason, the inversion preventing electrode 113 is coupld to the emitter electrode 111, and the gap region G is enclosed by the silicon oxide boundary 103 and the inversion preventing or stopping electrode 113 against the collector region 105, to thereby reduce the leakage current.

In FIGS. 7 and 8, reference numeral 114 denotes a silicone resin passivation layer. The portions of the electrode 3 serving as the field plate are indicated by the dotted areas.

The inversion preventing or stopping electrode may be formed simultaneously with implementation of the other electrodes through evaporation or other known technique by resorting to the use of an appropriately designed mask pattern.

As will be appreciated from the foregoing description, the present invention finds general applications to the implementation of the semiconductor integrated circuit device without involving any complicated fabrication processes, regardless of the kinds of the semiconductor elements such as transistor, thyristor, diode or the like as well as the pattern configuration of the integrated circuit in which various elements are to be integrated.

The effect of the leakage current reduction in semiconductor integrated circuit devices according to the above-described field plates were tested.

FIG. 9 graphically illustrates distributions of the reverse leakage current in a thyristor according to an embodiment of the present invention in comparison with those in a conventional thyristor of almost the same configuration but having no inversion preventing electrode. More particularly, hatched bars illustrate the occurrence of the leakage current in conventional thyristors, i.e. those having no inversion stopping electrode. It can be seen that the reverse leakage current in the thyristor according to the invention is reduced to about 1/10000 of that of the conventional ones, and whereby a high voltage blocking capability is obtained.

FIG. 10 shows another version of the semiconductor integrated circuit device according to the invention. In this figure, similar parts to those shown in FIGS. 1 and 2 are designated by similar reference numerals or symbols.

Although the inversion preventing electrode 11 is provided and connected to the cathode electrode 10 as is in the case of FIG. 3, this electrode 11 does not extend up to the silicon oxide film 3. However, there is provided an N-type region 14 of high impurity concentration between the inversion preventing electrode 11 and the silicon oxide film 3, as viewed in the planar pattern.

When a reverse or positive voltage is applied to the gate electrode 9 with respect to the anode electrode 8, the inversion layer $C_3$ tends to extend toward the P-type base or gate region 6 from the P-type emitter or anode region 5. At the N-type region 14 of a high impurity concentration, positive holes which constitute the inversion layer are neutralized by negative electrons presented by the impurities, whereby the extension of the inversion layer is stopped at the region 14 of high impurity concentration. In other words, the region 14 of high impurity concentration serves as the channel stopper. As a consequence, the region 14 cooperates with the inversion preventing electrode 11 to prevent the P-type emitter layer 5 and the P-type base layer 6 from being electrically interconnected by an inversion layer. Thus, the leakage current does not occur. The structure of this embodiment is effective when the inversion preventing electrode 11 is not allowed to be extended to the silicon oxide film 3.

It will be apparent that the foregoing description applies similarly to those elements having reversed conductivity types to those of the illustrated elements. Further, it goes without saying that the teaching of the invention can equally be applied to the semiconductor chips of PN-junction isolation type and air gap isolation type. Further, the semiconductor chip may have a surface in which recesses are formed.

What is claimed is:

1. A semiconductor integrated circuit device comprising:
   (a) a monolithic semiconductor chip including a plurality of island regions carried in a carrier region, each of said island regions being isolated from said carrier region and from other island regions by an associated island barrier;
   (b) at least one of said island regions being of a first conductivity type and having at least two diffused regions of a second conductivity type opposite to said first conductivity type formed therein and isolated from each other;
   (c) respective electrodes connected to said diffused regions with low resistance through an insulator film provided on said island region; and
   (d) an inversion preventing electrode connected with one of said electrodes, and disposed relative to said island barrier and said electrode so that said inversion preventing electrode, said island barrier and said one electrode enclose the associated diffused region to which said one electrode is formed from the other diffused region when viewed in the plane of said semiconductor chip.

2. A semiconductor integrated circuit device according to claim 1, wherein said inversion preventing electrode extends on said insulation film to said island barrier.

3. A semiconductor integrated circuit device according to claim 1, wheren both of said electrodes extend on said insulation film beyond the edges of PN-junctions exposed on the semiconductor chip surface, said PN-junctions being formed by said island region and said one and other diffused regions.

4. A semiconductor integrated circuit device comprising:
   (a) a monolithic semiconductor chip including a plurality of island regions formed in a carrier region, each of said island regions being isolated from said carrier region and from other island regions by an associated island barrier;
   (b) one of said island regions being of a first conductivity type and having at least two diffused regions of a second conductivity type opposite to said first conductivity type isolated from each other;
   (c) one of said diffused regions including an additional diffused region of said first conductivity type formed therein;
   (d) a first, a second and a third electrode contacting said additional diffused region of said first conductivity type, said one and the other diffused regions of said second conductivity type, respectively, with low resistances through an insulation film provided on said island region; and
   (e) an inversion preventing electrode connected to one of said first and second electrodes, said inversion preventing electrode being disposed relative to said one electrode and said island barrier so that said inversion preventing electrode, said one electrode and said island barrier enclose said additional diffused region of said first conductivity type and said one diffused region of said second conductivity type from said other diffused region of said second conductivity type when viewed in a plane of said semiconductor chip.

5. A semiconductor integrated circuit device according to claim 1, wherein said carrier region comprises a polycrystalline semiconductor support plate.

6. A semiconductor integrated circuit device according to claim 5, wherein said island regions are formed of single crystal semiconductor.

7. A semiconductor integrated circuit device according to claim 1, wherein said island barrier comprises a dielectric film.

8. A semiconductor integrated circuit device according to claim 6, wherein said island barrier comprises a dielectric film.

9. A semiconductor integrated circuit device according to claim 4, wherein said carrier region comprises a polycrystalline semiconductor support plate.

10. A semiconductor integrated circuit device according to claim 9, wherein said island regions are formed of a single crystal semiconductor.

11. A semiconductor integrated circuit device according to claim 4, wherein said island barrier comprises a dielectric film.

12. A semiconductor integrated circuit device according to claim 1, wherein one of said electrodes has an extension overlying an associated pn junction between one of said diffused regions and said island region in a direction toward said other diffused region.

13. A semiconductor integrated circuit device according to claim 4, wherein said second electrode includes a portion overlying across an associated pn junction between one of said diffused regions and said island region in a direction toward the other diffused region.

14. A semiconductor integrated circuit device comprising:
(a) a monolithic semiconductor chip including a plurality of island regions carried in a carrier region, each of said island regions being isolated from said carrier region and from other island regions by an associated island barrier;
(b) at least one of said island regions being of a first conductivity type and having at least two diffused regions of a second conductivity type opposite to said first conductivity type formed therein and isolated from each other;
(c) respective electrodes connected to said diffused regions with low resistance through an insulator film provided on said island region;
(d) an inversion preventing electrode connected with one of said electrodes; and
a region of the first conductivity type and of a high impurity concentration provided between said inversion preventing electrode and said island barrier, said region of high impurity concentration being formed relative to said one of said electrodes, said inversion preventing electrode and said island barrier so that said high impurity concentration region, said one of said electrodes, said inversion preventing electrode and said island barrier enclose one of the diffused regions which is provided with said one of said electrodes to which said inversion preventing electrode is connected.

15. A semiconductor integrated circuit device comprising:
(a) a monolithic semiconductor chip including a plurality of island regions formed in a carrier region, each of said island regions being isolated from said carrier region and from other island regions by an associated island barrier;
(b) one of said island regions being of a first conductivity type and having at least two diffused regions of a second conductivity type opposite to said first conductivity type isolated from each other;
(c) one of said diffused regions including an additional diffused region of said first conductivity type formed therein;
(d) a first, a second and a third electrode contacting said additional diffused region of said first conductivity type, said one and the other diffused regions of said second conductivity type, respectively, with low resistances through an insulation film provided on said island region;
(e) an inversion preventing electrode connected to one of said first and second electrodes; and
(f) a region of the first conductivity type and of a high impurity concentration provided between said inversion preventing electrode and said island barrier, said region of high impurity concentration being disposed relative to said one electrode, said inversion preventing electrode and said island barrier so that said inversion preventing electrode, said one of said first and second electrodes to which said inversion preventing electrode is connected, said high impurity concentration region and said island barrier enclose said additional diffused region of said first conductivity type and said one diffused region of said second conductivity type from said other diffused region of said second conductivity type when viewed in a plane of said semiconductor chip.

16. A semiconductor integrated circuit device according to claim 14, wherein said carrier region comprises a polycrystalline semiconductor support plate.

17. A semiconductor integrated circuit device according to claim 15, wherein said carrier region comprises a polycrystalline semiconductor support plate.

18. A semiconductor integrated circuit device according to claim 14, wherein said island regions are formed of a single crystal semiconductor.

19. A semiconductor integrated circuit device according to claim 15, wherein said island regions are formed of a single crystal semiconductor.

20. A semiconductor integrated circuit device according to claim 14, wherein said island barrier comprises a dielectric film.

21. A semiconductor integrated circuit device according to claim 15, wherein said island barrier comprises a dielectric film.

22. A semiconductor integrated circuit device according to claim 14, wherein one said electrodes has an extension overlying an associated pn junction between one of said diffused regions and said island region in a direction toward said other diffused region.

23. A semiconductor integrated circuit device according to claim 15, wherein said second electrode includes a portion overlying across an associated pn junction between one of said diffused regions and said island region in a direction toward the other diffused region.

24. A monolithic semiconductor integrated circuit device formed in a substrate which includes a plurality of island semiconductor regions and a carrier region physically supporting said island semiconductor regions in one body, the carrier region forming an electrically isolating island boundary with each of said island semiconductor regions by an insulative region or a pn junction, at least one of the island semiconductor regions comprising:
a first and a second doped region formed in at least one of said island regions, each doped region having a conductivity type opposite to that of the island region and forming a pn junction with the island region;
an insulating film formed on the substrate and including a first and a second contact opening which expose contact portions of the first and second doped regions, respectively;
a first and a second electrode formed on the insulating film and on the contact portions of the first and second doped regions for forming electrical connection with said first and second doped regions, respectively, said first electrode covering part of the first doped region and an adjacent part of the island region and leaving uncovered part of the first doped region and an adjacent uncovered part of island region, said first electrode including a contact portion directly contacting the contact portion of said first doped region through said first opening, a field plate portion being contiguous to the contact portion and overlying an area of the first doped region and an adjacent area of the island region across the pn junction formed between the first doped region and the island region, and a lead portion being contiguous to an end of said field plate portion and overlying an area of the island region and an adjacent area of the carrier region across the island boundary; and an inversion preventing electrode formed on the insulating film contiguous to another end of said field plate portion near said uncovered part of the first doped region and overlying an area of the island region which is spaced apart from the uncovered part of the first doped region, the first electrode, the inversion preventing electrode and the island boundary substantially enclosing the first doped region to leave the second doped region outside of the enclosure.

25. A monolithic integrated circuit device according to claim 24, wherein said one island region further comprises a third doped region of a conductivity type opposite to that of the first doped region, formed in the uncovered part of said first doped region, the insulating film having a third opening on the third doped region, and a third electrode extending from the third doped region to the outside of the island region.

26. A monolithic integrated circuit device according to claim 25, wherein said inversion preventing electrode has an additional portion which overlies the carrier region across the island boundary.

27. A monolithic integrated circuit device according to claim 25, wherein said island region further includes a heavily doped fourth region located adjacent to the island boundary and beneath the inversion preventing electrode.

28. A monolithic integrated circuit device according to claim 25, wherein said second electrode includes a portion overlying the entire edge of the pn junction of the second doped region.

29. A monolithic integrated circuit device according to claim 25, wherein said third electrode includes a portion overlying a main part of the edge of the pn juction of the uncovered part of the first doped region.

30. A monolithic integrated circuit device according to claim 25, wherein said inversion preventing electrode has a width smaller than that of said first electrode.

31. A monolithic semiconductor integrated circuit device formed in a substrate which includes a plurality of island semiconductor regions and a carrier region physically supporting said island semiconductor regions in one body, the carrier region forming an electrically isolating island boundary with each of said island semiconductor regions by an insulative region or a pn junction, at least one of the island semiconductor regions being of a first conductivity type and comprising:

a first and a second doped region formed in at least one of the island regions and having a second conductivity type opposite to said first conductivity type and forming pn junctions with the island region;

an isulating film formed on the substrate and including a first and a second contact opening which expose contact portions of the first and second doped regions, respectively;

a first and a second electrode formed on the insulating film and on the contact portions of the first and second doped regions for forming electrical connection with said first and second doped regions, respectively, said first electrode covering part of the first doped region and an adjacent part of the island region and leaving uncovered part of the first doped region and an adjacent uncovered part of said island region, said first electrode including a first portion contacting the said first doped region and extending beyond the associated pn junction formed between the first doped region and the island region to an adjacent area of the island region, a second portion being contiguous to an end of said first portion and overlying an area of the island region and an adjacent area of the carrier region across the island boundary and a third portion being contiguous to another end of said first portion near said uncovered part of the first dope region and overlying an area of the island region which is spaced apart from the uncovered part of the first doped region;

the first electrode and the island boundary substantially enclosing the first doped region to leave the second doped region outside of the enclosure.

32. A monolithic semiconductor integrated circuit device according to claim 31, wherein said one island region further includes an additional doped region formed in the uncovered part of the first region and an additional electrode extending from the additional region to the island boundary within the enclosure.

* * * * *